US012762303B2

(12) United States Patent
Thompson et al.

(10) Patent No.: US 12,762,303 B2
(45) Date of Patent: Oct. 13, 2026

(54) PROCESS FOR IDENTIFYING AND IMPLEMENTING ADDITIVE MANUFACTURING EVACUATION GAS FLOW IMPROVEMENTS

(71) Applicant: The Boeing Company, Chicago, IL (US)

(72) Inventors: Richard J. Thompson, Huntsville, AL (US); Craig S. Bosma, Madison, AL (US); Michael S. Lindgren, Ravenel, SC (US); Troy A. Haworth, Snohomish, WA (US); Cory C. Cunningham, Auburn, WA (US)

(73) Assignee: The Boeing Company, Chicago, IL (US)

( * ) Notice: Subject to any disclaimer, the term of this patent is extended or adjusted under 35 U.S.C. 154(b) by 1131 days.

(21) Appl. No.: 17/492,033

(22) Filed: Oct. 1, 2021

(65) Prior Publication Data

US 2023/0107013 A1 Apr. 6, 2023

(51) Int. Cl.
*G06F 30/20* (2020.01)

(52) U.S. Cl.
CPC .................................... *G06F 30/20* (2020.01)

(58) Field of Classification Search
CPC ........... G06F 30/20; G06F 30/23; G06F 30/28
See application file for complete search history.

(56) References Cited

U.S. PATENT DOCUMENTS

2006/0129462 A1* 6/2006 Pankl ................. G06Q 30/0613 705/26.81

OTHER PUBLICATIONS

Altmeppen, Johannes, et al. "Transient simulation of particle transport and deposition in the laser powder bed fusion process: A new approach to model particle and heat ejection from the melt pool." Additive Manufacturing 46 (2021) (Year: 2021).*
Ansys, "Ansys Fluent: Using the Adjoint Solver to Optimize the Shape of a Duct in a Bounded Space—Part II", YouTube Video, Feb. 26, 2019, URL: www(dot)youtube(dot)com/watch?v=huvn9PQHC6U (Year: 2019).*
Chen, Qiang, et al. "Three-dimensional finite element thermomechanical modeling of additive manufacturing by selective laser melting for ceramic materials." Additive Manufacturing 16 (2017): 124-137 (Year: 2017).*

(Continued)

*Primary Examiner* — David A Hopkins
(74) *Attorney, Agent, or Firm* — Harrity & Harrity, LLP

(57) ABSTRACT

A computer-readable medium includes recorded instructions for performing a method of improving evacuation gas flow performance of an additive manufacturing build chamber. Instruction execution by a processor of a host computer device causes the processor to receive an input data set inclusive of flow field data of an inert gas through the build chamber, and an improvement metric operable to characterize flow improvements therein. The processor generates a flow field data set in response to the input data set, and extracts evacuation streamline data from the flow field data set. The streamline data describes expected flow paths of the inert gas through the modified build chamber. Instruction execution also causes the processor to generate an output data set using the streamline data, with the output data set including the flow improvements as characterized by the metric.

20 Claims, 5 Drawing Sheets

(56) References Cited

OTHER PUBLICATIONS

Chen, Xiang-Xin, and Wei-Cheng Wang. "The applications of particle image velocimetry (PIV) to experimentally observe the flow behaviors inside the Selective Laser Melting (SLM) working chamber." Flow Measurement and Instrumentation 73 (2020): 101738 ( Year: 2020).*

Chen, Yu, Guglielmo Vastola, and Yong Wei Zhang. "Optimization of inert gas flow inside laser powder bed fusion chamber with computational fluid dynamics." (2018). Solid Freeform Fabrication 2018: Proceedings of the 29th Annual International Solid Freeform Fabrication Symposium (Year: 2018).*

Chien, Cheng-Yen, et al. "Numerical and experimental investigation into gas flow field and spattering phenomena in laser powder bed fusion processing of Inconel 718." Materials & Design 210 (2021): 110107. (Year: 2021).*

Moran, T. P., et al. "Spatial inhomogeneity of build defects across the build plate in laser powder bed fusion." Additive Manufacturing 47 (2021): 102333 (Year: 2021).*

Schniedenharn, Maximilian, Frederik Wiedemann, and Johannes Henrich Schleifenbaum. "Visualization of the shielding gas flow in SLM machines by space-resolved thermal anemometry." Rapid Prototyping Journal 24.8 (2018): 1296-1304 (Year: 2018).*

Tzeng, Sz-Jia, Xiang-Xin Chen, and Wei-Cheng Wang. "Numerical studies of metal particle behaviors inside the selective laser melting (SLM) chamber through computational fluid dynamics (CFD)." The International Journal of Advanced Manufacturing Technology 107 (2020): 4677-4686. (Year: 2020).*

Veetil, Jithin Kozhuthala, et al. "Build position-based dimensional deviations of laser powder-bed fusion of stainless steel 316L." Precision engineering 67 (2021): 58-68. (Year: 2021).*

Wirth, Florian, et al. "Influence of the inert gas flow on the laser powder bed fusion (LPBF) process." Industrializing Additive Manufacturing: Proceedings of AMPA2020. Springer International Publishing, 2021 (Year: 2021).*

Shen, Haopeng, et al. "Influence of gas flow speed on laser plume attenuation and powder bed particle pickup in laser powder bed fusion." Jom 72.3 (2020): 1039-1051. Abstract, pp. 1039-1042 (Year: 2020).*

Ly, Sonny, et al. "Metal vapor micro-jet controls material redistribution in laser powder bed fusion additive manufacturing." Scientific reports 7.1 (2017): 4085. pp. 2-4 (Year: 2017).*

Jakumeit, Jürgen, et al. "Modelling the complex evaporated gas flow and its impact on particle spattering during laser powder bed fusion." Additive Manufacturing 47 (2021): 102332. Abstract, fig. 7 and 13-14 and their accompanying description (Year: 2021).*

Cook, Peter S., and Anthony B. Murphy. "Simulation of melt pool behaviour during additive manufacturing: Underlying physics and progress." Additive Manufacturing 31 (2020): 100909. Fig. 9 and its accompanying description (Year: 2020).*

Noskov, Aleksey, et al. "Characterization of ultrafine particles emitted during laser-based additive manufacturing of metal parts." Scientific Reports 10.1 (2020): 20989. Abstract, pp. 2, 4-8 (Year: 2020).*

Merriam Webster Dictionary, Definition of "stochastic", accessed electronically on Dec. 19, 2025, URL: merriam-webster(dot)com/dictionary/stochastic (Year: 2025).*

Protolabs, "3D Printing for End-Use Production An analysis of additive technologies that are redefining 3D printing as an end-use manufacturing method", Wayback Machine archive date Oct. 27, 2020, URL: protolabs(dot)com/resources/ guides-and-trend-reports/3d-printing-for-end-use-production/ (Year: 2020).*

Zhang, Xiaobing, Charles Tuffile, and Bo Cheng. "Computational modeling of the inert gas flow behavior on spatter distribution in selective laser melting." Proceedings of the 30th Annual International Solid Freeform Fabrication Symposium-An Additive Manufacturing Conference, Austin, TX, USA. 2019. (Year: 2019).*

* cited by examiner

PROCESS FOR IDENTIFYING AND IMPLEMENTING ADDITIVE MANUFACTURING EVACUATION GAS FLOW IMPROVEMENTS

BACKGROUND

Additive manufacturing (AM), a process also frequently referred to in the art as three-dimensional (3D) printing, has tremendous utility in a wide range of industries and beneficial applications, including but not limited to the fabrication of specialized components and devices. A notable advantage of AM is its ability to quickly fabricate lightweight, one-piece monolithic components regardless of the component's internal or external geometric complexity.

AM processes generally commence with the creation of a working 3D model of a desired component. The modeling process is typically assisted Computer-Aided Engineering (CAE) techniques using finite element analysis (FEA), e.g., using off-the-shelf Computer-Aided Design (CAD) or Computer-Aided Manufacturing (CAM) software. Once a suitable 3D model of the component of interest has been constructed, software simulations are run on the 3D model using a modeling hardware suite to estimate an expected performance of the component across a defined range of static and dynamic operating conditions.

Once an acceptable simulation result is observed, the 3D model is uploaded to a 3D printer. A physical specimen of the component is then constructed in an additive/layer-by-layer manner. For example, a laser sintering processes may be used to direct heat energy from one or more high-power scanning lasers onto an application-specific powder feedstock. The powder feedstock is situated on an exposed build plate within an enclosed build chamber. Energy from the incident laser beam coalesces the powder feedstock into a solid or porous component. Unused residual powder feedstock is then removed from the build chamber to reveal the fully-formed 3D-printed component. Thereafter, the 3D-printed component may be subjected to various post-processing techniques such as build plate separation, thermal stress relief, and possible surface finishing techniques including buffing, polishing, or grinding as needed based on the end use of the 3D-printed component.

SUMMARY

Disclosed herein are automated methods and associated host computer devices that together identify possible evacuation gas flow improvements in an enclosed build chamber of an additive manufacturing (AM) process. During representative AM/three-dimensional (3D) printing, a supply of an application-suitable powder feedstock, e.g., titanium or aluminum in a representative and non-limiting aerospace component use case, is progressively coalesced into a melt pool on a build plate using one or more high-power lasers. An application-suitable inert gas such as argon is typically used in the build chamber to avoid oxidation of the powder feedstock when the powder feedstock is melted by the lasers. Due to the high energy levels of the incident laser beam(s), some amount of the powder feedstock is vaporized and/or ejected from the melt pool within the build chamber, thereby forming a suspended cloud of smoke and other debris. The debris cloud may linger above the build plate. Left unabated, the debris cloud could increase in size to the point of interfering with or possibly blocking the laser beam. This in turn can lead to variable structural stress or undesirable fatigue properties in the 3D-printed component.

To facilitate effective evacuation of the debris cloud and thus minimize recirculation or dwell time of the debris cloud within the build chamber, the above-noted inert gas may be introduced through one or more chamber inlets and circulated through a volume of the build chamber as an evacuation gas flow (EGF). However, EGF circulation is not necessarily optimized for a given application. For instance, off-the-shelf AM build chambers are often employed in the construction of unique, highly specialized components, such as but not limited to specialized aerospace parts. Such components potentially undergo tremendous stresses or strains in operation, such as in the exemplary case of 3D-printed propulsor components, e.g., turbofans, thruster nozzles, or combustion chambers. The present solutions therefore seek to identify possible structural improvements to the existing geometry and/or equipped features of an AM build chamber such that EGF performance is optimized, laser beam interference is minimized, and variable structural stress, 3D-printed component strength, and/or undesirable fatigue properties in the 3D-printed component are improved.

To that end, a host computer device or several such networked devices are configured as set forth in detail herein to quickly and accurately identify potentially advantageous AM build chamber modifications, with the option of comparing multiple different possible structural variations in an iterative process, and thus without the time and expense of manufacturing and testing individual physical specimens.

By way of an initial example, a baseline build chamber may be provided by a supplier, or a proposed build chamber may exist purely as a design concept, with "baseline" as used herein referring, in an initial or single iteration of the present method, to an original/unmodified version of the build chamber. With each subsequent iteration, a new baseline is created, and thus an output of a first iteration of the method acts as the baseline for the second iteration, and so forth. The envisioned structural improvements to the baseline build chamber as contemplated herein would potentially improve EGF performance relative to that of the baseline build chamber. EGF performance is quantified herein using identified EGF vectors or "streamlines" passing through or circulating/recirculating within the volume of the baseline build chamber. When applied to an AM process, the described methodology has the desirable effect of improving EGF performance of the baseline build chamber and decreasing the amount of suspended particulate matter remaining above the build plate in the path of the laser beam(s), with the latter problem postulated herein to be a fundamental root cause of the above-noted component variability. Ultimately, the derived improvements are intended lead to more laminar flow conditions within critical areas of the build chamber, in lieu of undesirable recirculation or "swirling" of the debris cloud above the build plate.

In particular, a computer-readable medium is disclosed herein on which instructions are recorded for improving EGF performance of a baseline build chamber for use in an AM process. In an embodiment, execution of the instructions by a processor of a host computer device causes the processor to receive an input data set inclusive of an improvement metric operable to characterize flow improvements in the EGF performance of a modified build chamber. The modified build chamber is a modified version of the baseline build chamber, with the input data set comprising a defined geometry of the modified build chamber and defined operating conditions thereof.

The execution of the instructions also causes the processor to generate an initial 3D flow field data set in response to the input data set, the initial 3D flow field data set being indicative of a flow of an inert gas within the modified build chamber, and to extract a set of evacuation streamline data from the initial 3D flow field data set corresponding to the EGF performance of the modified build chamber, with "extract" referring to calculation or derivation of the evacuation streamline data from the larger set of information present in the initial 3D flow field data set. The set of evacuation streamline data describes expected flow paths of the inert gas through one or more predetermined regions of interest within the modified build chamber. The execution of the instructions also causes the processor to generate an output data set using the set of evacuation streamline data. The output data set comprises the flow improvements as characterized by the improvement metric.

In an aspect of the disclosure, the execution of the instructions by the processor of the host computer device causes the processor to use the output data set to request construction of the modified build chamber.

The execution of the instructions by the processor may in some configurations causes the processor to receive, as part of the input data set, a flow field data set from a computer system in communication with the host computer device. In such an embodiment, the execution of the instructions by the processor may optionally cause the processor to receive the initial 3D flow field data set from a particle-velocimetry imaging system, with the computer system comprising the particle-velocimetry imaging system in this embodiment.

The execution of the instructions by the processor may cause the processor to receive the improvement metric from a human-machine interface in communication with the host computer device.

The defined operating conditions noted above may include a pressure, at least one inlet velocity, and at least one outlet velocity of the inert gas.

In a possible implementation of the computer-readable medium, the execution of the instructions by the processor causes the processor to generate the initial 3D flow field data set using one or more of a physical simulation, a reduced order model, or a machine-learned model.

The execution of the instructions by the processor may also cause the processor to quantity a residence time of a debris cloud present within the modified build chamber.

The input data set in a possible embodiment comprises target performance criteria, with the execution of the instructions by the processor causing the processor to perform one or more iterative loops on the output data set to thereby resolve an optimal geometric solution for the modified build chamber. The optimal geometric solution is one in which no further improvement is realized on the improvement metric.

Also disclosed herein is a method operable to improve EGF performance of a baseline build chamber for use during an AM process. The method according to an exemplary embodiment includes receiving, via a host computer device, an input data set inclusive of an improvement metric operable to characterize improvements in the EGF performance of a modified build chamber. The modified build chamber is a modified version of the baseline build chamber, and the input data set comprises a defined geometry of the modified build chamber and defined operating conditions thereof. The method also includes generating, via the host computer device, an initial 3D flow field data set in response to the input data set, the initial 3D flow field data set being indicative of a flow of an inert gas within the modified build chamber.

Additionally, the method includes extracting, via the host computer device, a set of evacuation streamline data from the initial 3D flow field data set corresponding to the EGF performance, the set of evacuation streamline data describing expected flow paths of the inert gas through the modified build chamber. The method also includes generating, via the host computer device, an output data set using the set of evacuation streamline data, wherein the output data set comprises the flow improvements in the EGF performance of the modified build chamber as characterized by the improvement metric.

The above summary is not intended to represent every embodiment or every aspect of the present disclosure. Rather, the foregoing summary merely provides an illustration or exemplification of some of the novel concepts and features set forth herein. The above-noted and other features and advantages will be readily apparent from the following detailed description of illustrated embodiments and representative modes for carrying out the disclosure when taken in connection with the accompanying drawings and appended claims. Moreover, the present disclosure expressly includes combinations and sub-combinations of the various elements and features presented herein.

Figure 1:
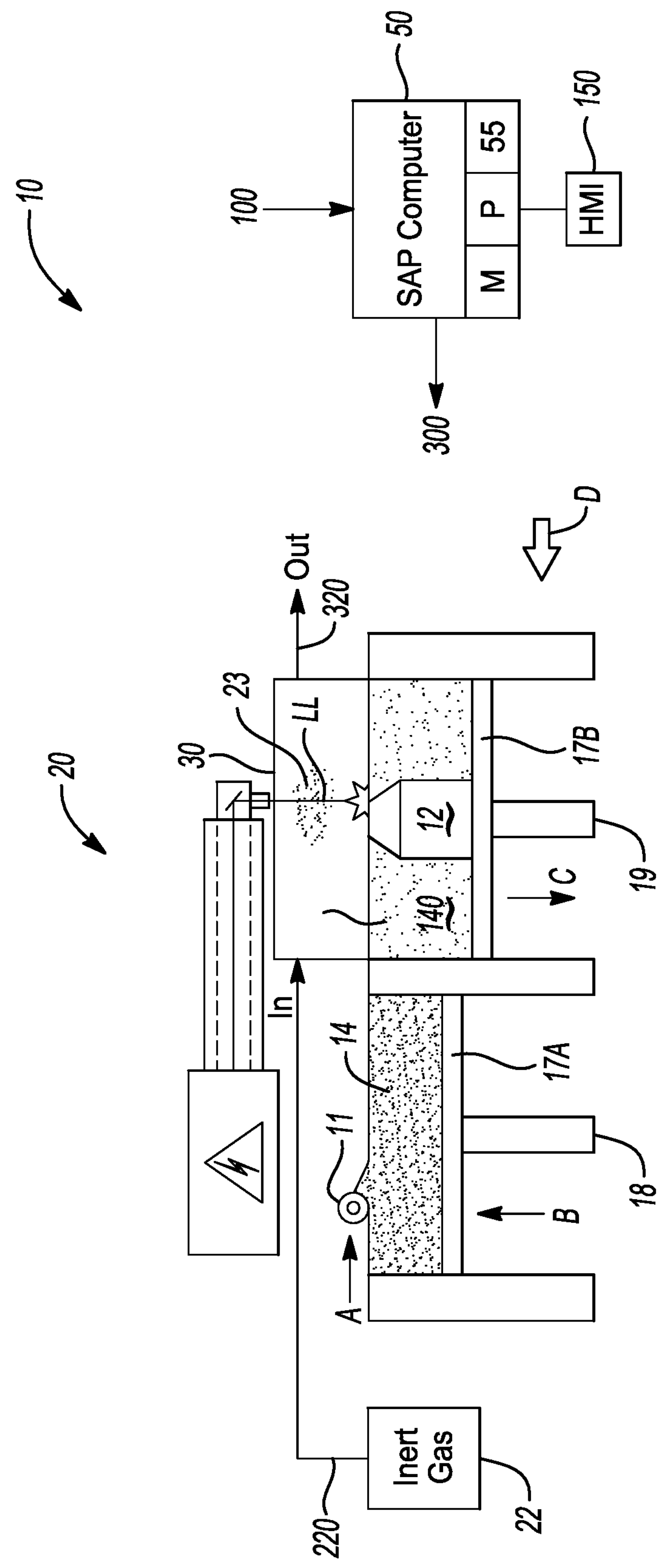
FIG. 1 is a schematic flow diagram of an exemplary additive manufacturing system and an associated host computer device configured to improve evacuation gas flow (EGF) performance in such a system in accordance with the present disclosure.

The present disclosure may be extended to modifications and alternative forms, with representative embodiments shown by way of example in the drawings and described in detail below. Inventive aspects of the disclosure are not limited to the disclosed embodiments. Rather, the present disclosure is intended to cover modifications, equivalents, combinations, and alternatives falling within the scope of the disclosure as defined by the appended claims.

DETAILED DESCRIPTION

This disclosure is susceptible of embodiment in many different forms. Representative embodiments of the disclosure are shown in the drawings and will herein be described in detail with the understanding that these embodiments are provided as an exemplification of the disclosed principles, not limitations of the broad aspects of the disclosure. To that extent, elements and limitations that are described, for example, in the Abstract, Background, Summary, and Detailed Description sections, but not explicitly set forth in the claims, should not be incorporated into the claims, singly or collectively, by implication, inference or otherwise.

For purposes of the present detailed description, unless specifically disclaimed: the singular includes the plural and vice versa; the words “and” and “or” shall be both conjunctive and disjunctive; the words “any” and “all” shall both mean “any and all”; and the words “including,” “containing,” “comprising,” “having,” and the like, shall each mean “including without limitation.” Additionally, the term “exemplary” as used herein means “serving as an example, instance, or illustration”, and thus does not indicate or suggest relative superiority of one disclosed embodiment relative to another. Words of approximation such as “about”, “substantially”, “approximately”, and “generally” are used herein in the sense of “at, near, or nearly at”, “within ±5% of”, “within acceptable manufacturing tolerances”, or logical combination thereof.

Throughout the drawings, corresponding reference numerals indicate like or corresponding parts and features. As used herein, the term “system” refers to combinations or collections of mechanical and electrical hardware, software, firmware, electronic control component, processing logic, and/or processor device, individually or in combination, including without limitation: application specific integrated circuit (ASIC), an electronic circuit, a processor (shared, dedicated, or group) that executes one or more software or firmware programs, memory to contain software or firmware instructions, a combinational logic circuit, and/or other suitable components that provide the described functionality.

Referring to the drawings, wherein like reference numbers refer to like features throughout the several views, FIG. 1 schematically depicts an exemplary additive manufacturing (AM) system 10 and a host computer device 50, with the latter labeled “SAP Computer” to indicate the use of the host computer device 50 herein as a Streamline Analysis Process computer. Within the scope of the present disclosure, the host computer device 50 performs calculations to automatically identify physical structural improvements in a baseline build chamber 30 of the AM system 10, with an eye toward improving evacuation gas flow (“EGF”) performance of the baseline build chamber 30, i.e., when evacuating a debris cloud 23 created as an undesirable byproduct of the AM process. Improved EGF performance in turn has the notable benefit of lowering variability of structural properties of builds, parts, or components constructed in modified versions of the baseline build chamber 30 as set forth herein.

Figure 4:
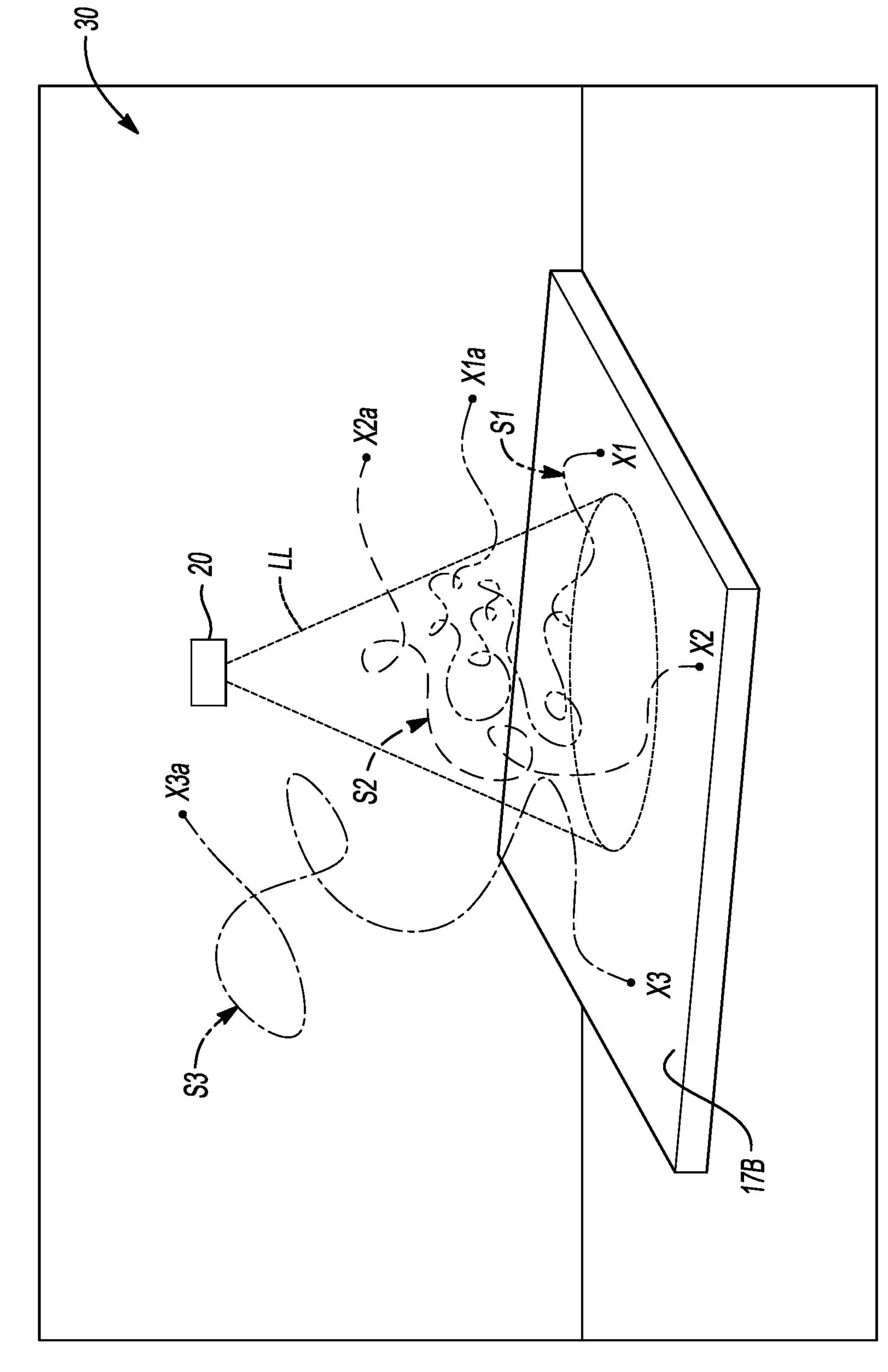
FIG. 4 is an illustration of a representative additive manufacturing (AM) build chamber, an incident laser beam, and a suspended debris cloud showing simplified streamlines.
Figure 5:
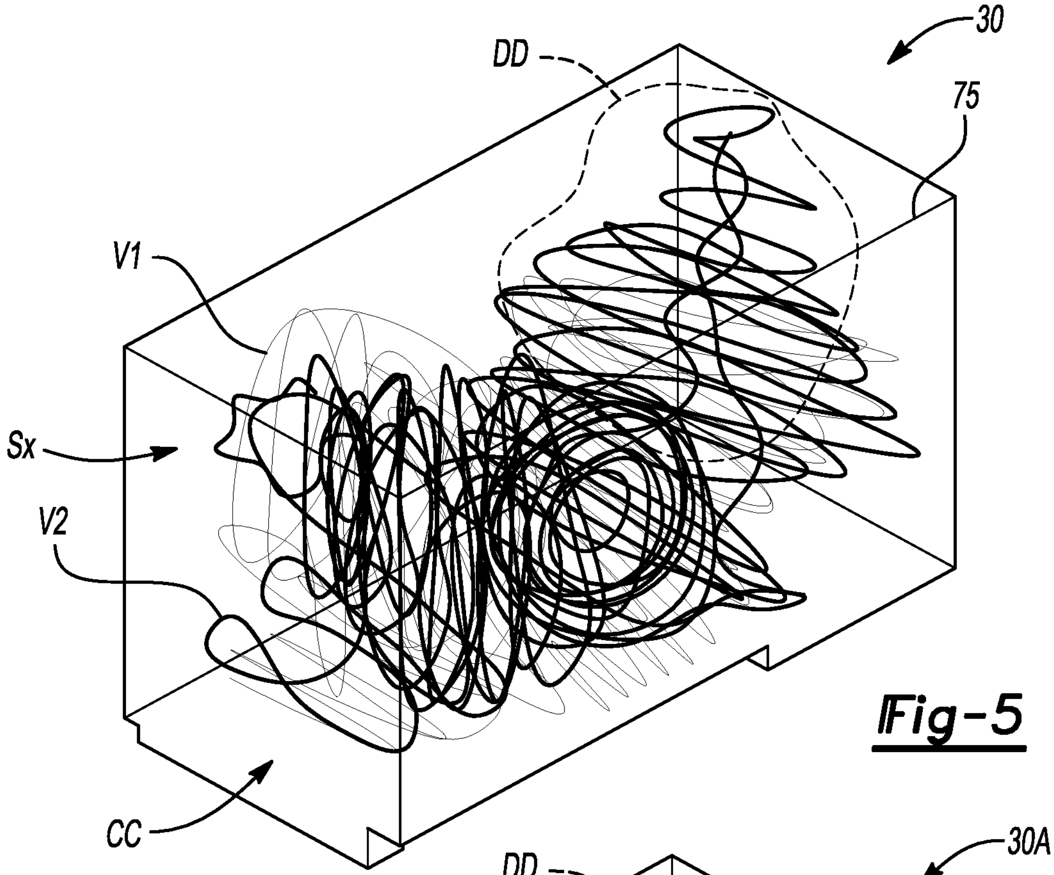
FIGS. 5 and 6 respectively illustrate representative EGF performance of a baseline build chamber and a modified build chamber in accordance with the disclosure.
Figure 6:
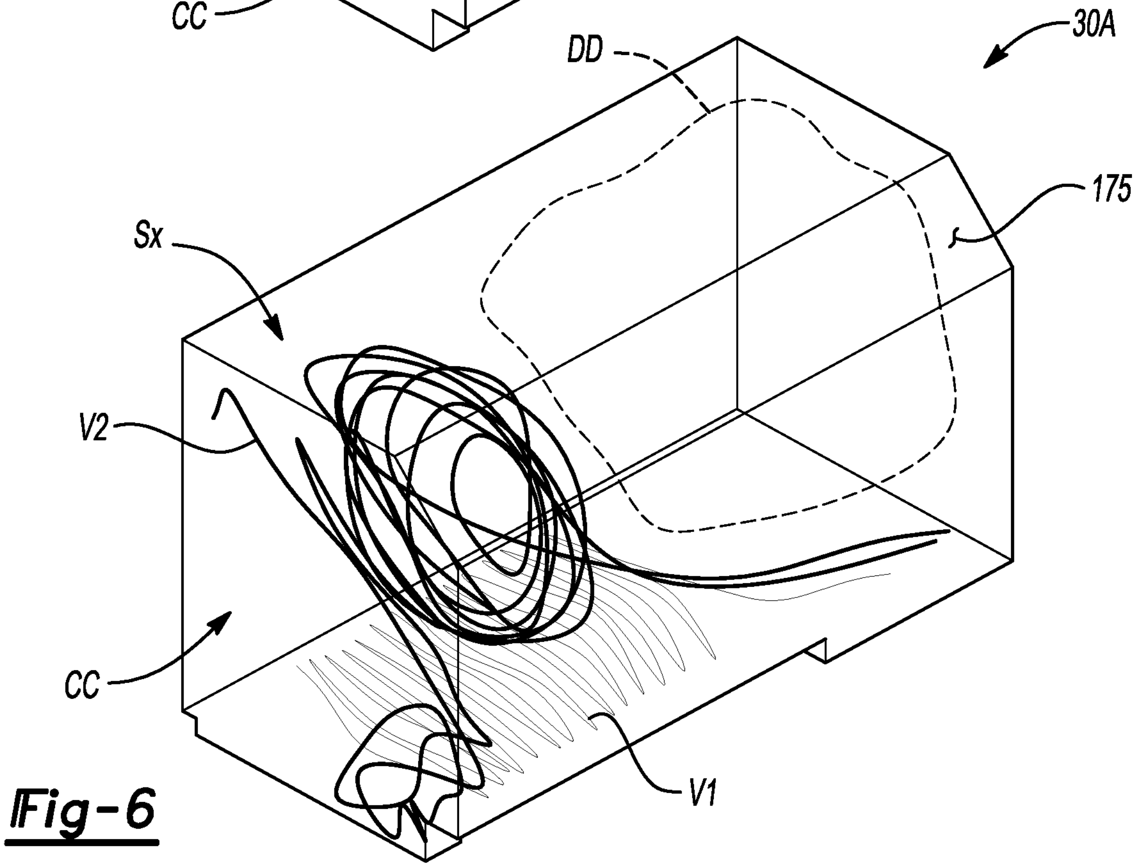

High variability in resulting stress and fatigue characteristics of a 3D-printed component 12 formed in the baseline build chamber 30 are postulated herein to result from poor or suboptimal evacuation of the debris cloud 23. The present approach is intended to help identify possible structural changes to the baseline build chamber 30 that could be implemented to reduce such variability. Additionally, the solutions set forth below may be used to compare different improvement ideas, e.g., when benchmarking suppliers of the baseline build chamber 30, or when evaluating competing baseline build chambers 30 for possible use in a given application. The present teachings could also be used to optimize parameters for a given set of improvement geometries to identify a “best possible” combination of one or more structural improvements to the baseline build chamber 30. A method 55 for identifying and ultimately implementing such improvements in accordance with the disclosure is described below with reference to FIGS. 2-4, with FIGS. 5 and 6 depicting a representative baseline build chamber 30 and a representative modified build chamber 30A.

As will be appreciated by those of ordinary skill in the art, and as generally described above, additive manufacturing entails the use of a powder feedstock 14, the thermal fusion of which into the resulting 3D-printed component 12 is assisted by directed heat energy from a high-power laser device 20. The laser device 20 in turn is configured to generate and output a laser beam (LL) as shown, which may be controlled using actuators (not shown) to sweep over a build plate 17B situated in the build chamber 30. Formation of the 3D-printed component 12 thus occurs in an accumulative or progressive/layer-by-layer manner. To that end, a suitable volume of the powder feedstock 14 may be positioned on a supply platform 17A. A powder regulator 11, e.g., a roller or plate, translates across the supply platform 17A in the general direction of arrow A. This motion enables the powder regulator 11 to move a thin layer of the powder feedstock 14 into the baseline build chamber 30 as the supply platform 17A rises in the direction of arrow B, e.g., using a hydraulic or pneumatic piston 18.

Once the powder regulator 11 deposits the powder feedstock 14 onto the build plate 17B, or onto a previously formed layer of the 3D-printed component 12 situated thereon, the laser device 20 directs or sweeps the laser beam (LL) onto the deposited powder feedstock 14 to construct a layer of the 3D-printed component 12. Once a layer has been constructed in this manner, the build plate 17B is lowered the direction of arrow C, e.g., using a piston 19, to enable another layer of the 3D-printed component 12 to be formed. This process repeats until the 3D-printed component 12 has been fully constructed. Residual powder feedstock 140 coating the 3D-printed component 12 thereafter may be removed from the baseline build chamber 30, e.g., using vacuum suction, compressed air, or pressure washing techniques, with such actions possibly assisted by manual brushing, as appreciated in the art.

During the illustrated additive manufacturing process, i.e., laser sintering, the high energy levels of the incident laser beam (LL) vaporizes some of the powder feedstock 14. This action creates the resulting particulate debris cloud 23 which, if left unabated, will tend to impede or diffuse the laser beam (LL), thus leading to variable structural stress or undesirable fatigue properties in the 3D-printed component 12. An inert gas 22 such as argon or nitrogen, also present for oxidation reduction purposes as noted above, is therefore circulated through the baseline build chamber 30, e.g., using an associated pump and conduit (not shown), to facilitate evacuation of the debris cloud 23, with at least one inlet flow (arrow 220, also labeled “In”) and at least one outlet flow (arrow 320, also labeled “Out”) shown in FIG. 1 for clarity. Depending on the construction of the baseline build chamber 30, EGF performance of the baseline build chamber 30 may remain suboptimal, however, possibly resulting in undesirable recirculation or sustained swirling pockets of the debris cloud 23 within the volume of the baseline build chamber 30.

The proposed solutions therefore identify and implement structural improvements to make to the baseline build chamber 30, with the goal of improving EGF performance as noted above. This occurs via programmed operation of the host computer device(s) 50 in lieu of, e.g., extensive experimental testing requiring design and fabrication of multiple different 3D-printed components 12 for test. Comparison of possible improvements may be limited to qualitative analysis. For instance, determining a subjectively and/or objectively “best” set of features that may possibly improve a given flow field within the baseline build chamber 30 often requires an increased number of experimental runs, with an increased number of structural features. In contrast, the present process, an example of which is described below with reference to FIG. 3, instead employs optional optimization process to greatly decrease the number of required runs and reduce computational expenses.

Figure 2:
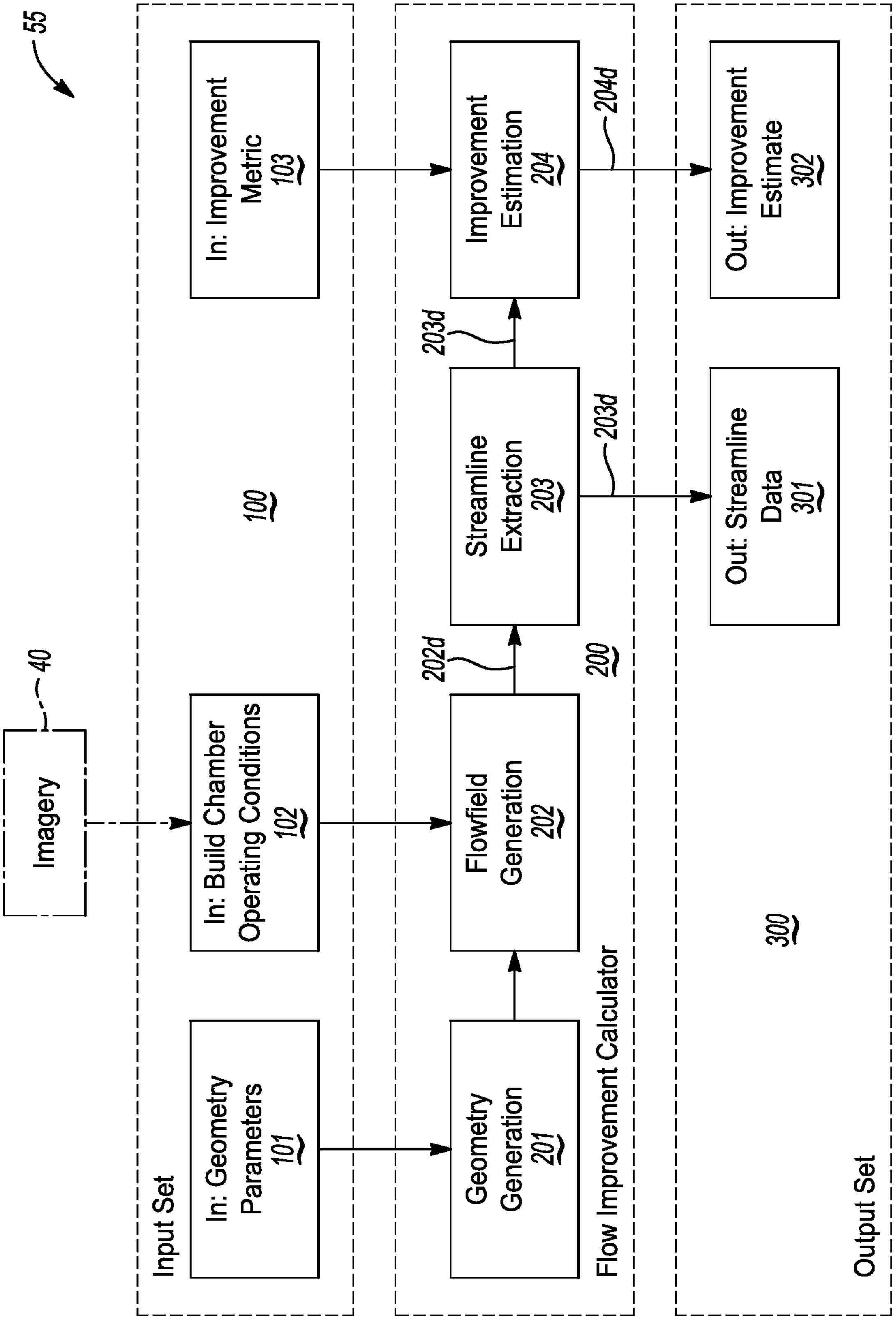
FIG. 2 is a flow chart describing a method for identifying and implementing structural changes to a baseline build chamber to realize EGF performance improvements using the representative host computer device of FIG. 1.
Figure 3:
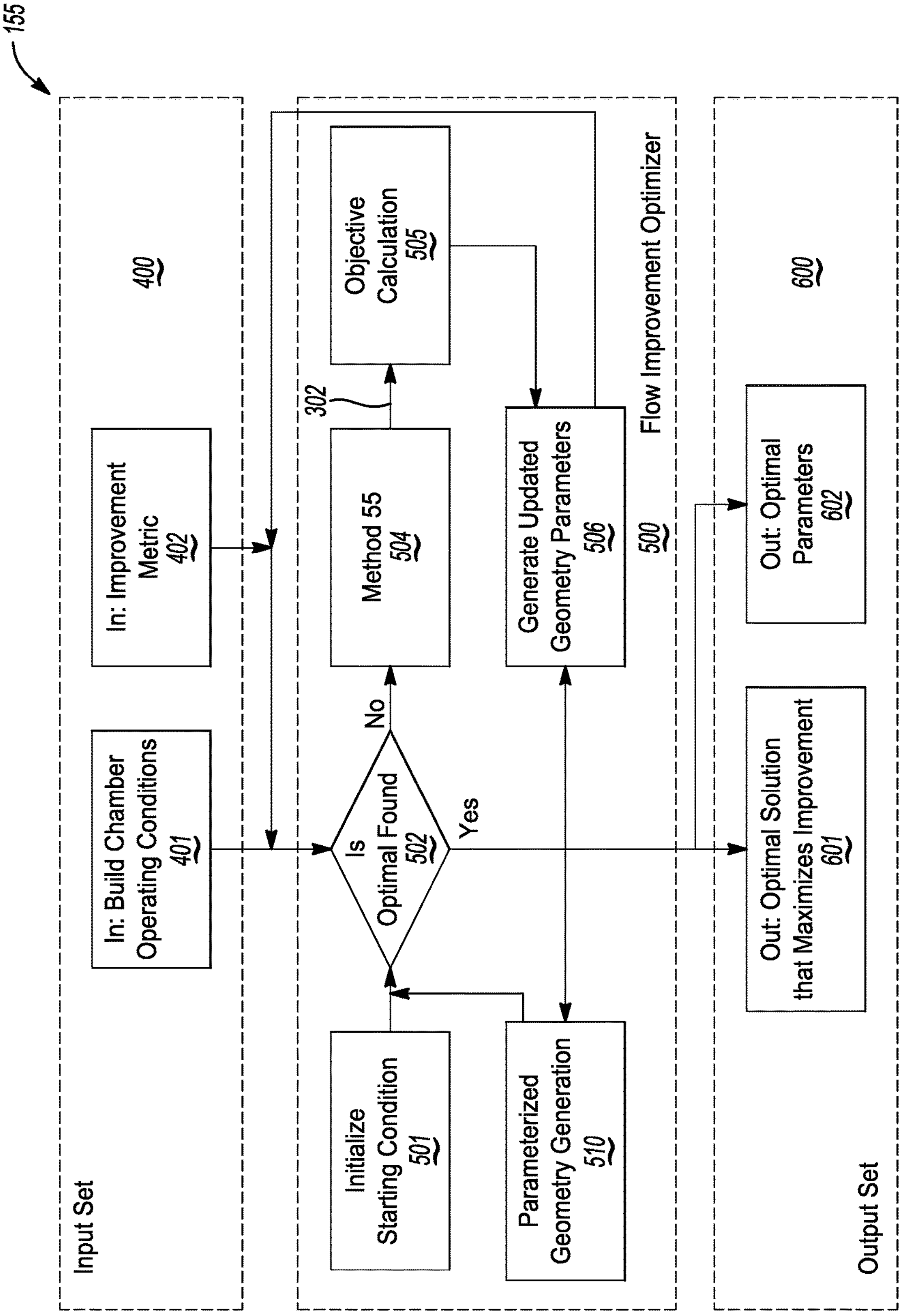
FIG. 3 is a flow chart describing an optional embodiment of the method shown in FIG. 2 enabling iterative optimization.

Still referring to FIG. 1, the illustrated host computer device 50 is a device or network of devices executes the method 55 of FIG. 2 and possibly the method 155 of FIG. 3 when performing streamline extraction and analysis using 3D flow field data, as opposed to performing build part variability measurements. This approach more rapidly enables exploration of structural features to add to improve EGF performance of the baseline build chamber 30. An improvement metric 103 (see FIG. 2), which is possibly user-selectable via a human-machine interface (HMI) device 150, may be used in some embodiments to facilitate selection of the improvement metric(s), e.g., as a touch screen device, a keyboard, and/or a keypad to facilitate user interaction with the functions and menu-based selections offered by the host computer device 50. The improvement metric 103 as contemplated herein ensures that a quantitative means is provided for directly comparing gas flow evacuation function of competing build chambers 30 and respective flow fields, such as a residence time of particles found within the flow field, as depicted in FIG. 4, with optimization of the flow field likewise enhanced via the optimization process of FIG. 3 to determine an optimal or "best possible" arrangement of one or more structural features in order to improve the flow field of a given baseline build chamber 30, e.g., for a particular build application using the same.

While the host computer device 50 of FIG. 1 is shown as a unitary control module for illustrative simplicity, the host computer device 50 may be equipped with one or more processors (P) and memory (M). The memory (M) includes application-sufficient amounts and types of tangible, non-transitory, computer-readable media. Although omitted for illustrative simplicity, the host computer device 50 also includes associated hardware and software, e.g., a high-speed clock, timer, input/output circuitry, buffer circuitry, and the like. Memory (M) includes sufficient amounts of read only memory, for instance magnetic memory or optical memory, possibly inclusive of flash drives, CD-ROMs, or other physical storage media, along with random access memory, video memory, and the like.

Instructions embodying the exemplary method 55 of FIG. 3 and the optional embodiment 155 thereof as shown in FIG. 3 may be programmed as computer-readable instructions and executed during operation of the host computer device 50. Implementations of the host computer device 50 may encompass one or more control modules, logic circuits, application-specific integrated circuits (ASICs), and/or other requisite hardware as needed in order to provide the programmed functionality of methods 55 and 155 as described herein.

The non-transitory, tangible components of the memory (M) are capable of storing machine-readable instructions in the form of one or more software or firmware programs or routines, combinational logic circuit(s), input/output circuit(s) and devices, signal conditioning and buffer circuitry and other components that can be accessed by one or more processors to provide a described functionality. Input/output circuit(s) and devices include analog/digital converters and related devices that monitor inputs from sensors, with such inputs monitored at a preset sampling frequency or in response to a triggering event. Software, firmware, programs, instructions, control routines, code, algorithms, and similar terms mean controller-executable instruction sets possibly including calibrations and look-up tables. Routines may be executed at periodic intervals during ongoing operation. Alternatively, routines may be executed in response to occurrence of a triggering event.

Additionally, communication between logic blocks or described hardware components may be accomplished using a direct wired point-to-point link, a networked communication bus link, a wireless link, or another suitable communication link. Communication as contemplated herein may include exchanging data signals in suitable form, including, for example, electrical signals via a conductive medium, electromagnetic signals via air, optical signals via optical waveguides, and the like. The data signals may include discrete, analog, and/or digitized analog signals representing inputs from sensors, actuator commands, and communication between controllers.

Also as used herein, the term "signal" refers to a physically discernible indicator that conveys information, and may be a suitable waveform (e.g., electrical, optical, magnetic, mechanical, or electromagnetic), such as direct current (DC), alternating current (AC), sinusoidal-wave, triangular-wave, square-wave, vibration, and the like, that is capable of traveling through a medium. The terms "calibration", "calibrated", and related terms refer to a result or a process that compares an actual or standard measurement associated with a device or system with a perceived or observed measurement or a commanded position for the device or system. A calibration as described herein can be reduced to a storable parametric table, a plurality of executable equations or another suitable form that may be employed as part of a measurement or control routine. A parameter is defined as a measurable quantity that represents a physical property of a device or other element that is discernible using one or more sensors and/or a physical model. A parameter may have a discrete value, e.g., either "1" or "0", or may be infinitely variable in value.

Ultimately, the host computer device 50 receives an input data set 100 and, after executing methods 55 and 155, generates an output data set 300. The output data set 300 is ultimately used as a blueprint for modifying the baseline build chamber 30 in a particular way, with such a tie-in of the function of the host computer device 50 with the end construction of the build chamber 30 indicated in FIG. 1 by arrow D. The host computer device 50 in some embodiments causes the processor (P) to use the output data set 300 to request construction of a modified version of the baseline build chamber 30, a non-limiting nominal version of which shown as modified build chamber 30A in FIG. 6. The respective input and output data sets 100 and 300 will now be described with reference to FIG. 2.

ANALYSIS OF BASELINE BUILD CHAMBER AND COMPARISON TO ALTERNATIVE CONSTRUCTIONS: Computer-readable programming code/instructions embodying the method 55 of FIG. 2, and possibly the alternative optimization routine of method 155 as shown in FIG. 3, may be recorded, stored, or encoded on a tangible, non-transitory computer-readable medium or media, i.e., the memory (M) shown in FIG. 1. Such instructions are selectively executed by one or more processors (P) of the host computer device 50 shown in FIG. 1 to improve the EGF performance of a baseline AM build chamber, e.g., the baseline build chamber 30 depicted in simplified form in FIG. 1. For illustrative clarity, the baseline build chamber 30 is described hereinafter as the starting point, with any modified version thereof being a modified build chamber 30A. Those skilled in the art will appreciate that, when several iterations are made in accordance with aspects of the disclosure, the baseline build chamber 30 of a given iteration is the simulated version existing prior to a modeled change, e.g., a modified build chamber 30A in a second iteration acts as the baseline build chamber 30 when performing a third iteration, and so forth.

Execution of the instructions by the processor (P) of the host computer device 50 causes the processor (P) to receive an input data set 100. The input data set 100 is inclusive of, or contains data that enables creation of, (i) flow field data of the inert gas 22 passing through a modified version of the baseline build chamber 30, e.g., the modified build chamber 30A of FIG. 6 as described below, and (ii) an improvement metric 103 operable to characterize flow improvements in the EGF function of relative to that of the baseline build chamber 30.

In some embodiments, derivation of items (i) and (ii) is assisted by measuring, uploading, or otherwise providing the host computer device 50 with geometric parameters block 101. Geometric parameters provided in block 101 collectively describe changes, differences, or additions to the geometry of the baseline build chamber 30 of FIG. 1, i.e., the starting design or configuration to which one or more possible flow optimizing modifications are to be applied. Non-limiting exemplary geometry parameters may include additional and/or reshaped or repositioned flow inlets or outlets, additional flow channels, baffles, vanes, chamfers, nozzles, nozzle holes, flow redirectors, pylons, and/or any other change or combination of changes to the geometry or internal structural configuration of the baseline build chamber 30.

The geometric parameters of block 101 may be either discrete, such as an integer number of baffles, binary, such as the presence or absence of a new vane, or continuous, e.g., the area, position, and/or length of a certain new vane or baffle. Block 101 may capture slight differences from a baseline configuration, such as differences in a recorder home position, overfill vent connection location or configuration, etc. Implementation of block 101 could be by way of a program or an executable script, or block 101 could be implemented as user "handles", e.g., an intuitive menu displayed via the HMI device 150 that allows a user to select configuration options from a displayed pull-down menu when inputting possible changes to the baseline build chamber 30 for performance simulation.

Additionally, a build chamber operating conditions block 102 may be determined as part of the input data set 100. Operating conditions of block 102 may include sufficient operating condition data for a physical simulation of the AM process, possibly including the operating pressure(s) and/or inlet velocity or velocities, outlet velocity or velocities, chamber temperatures, and any other boundary and initial conditions descriptive of the prevailing conditions within the volume of the baseline build chamber 30. Although some implementations could modify the conditions of block 102 when seeking EGF performance improvements, such conditions may be calibrated and thereafter unchanged to minimize complexity when implementing the present solutions.

Alternatively, experimental data and/or measurements are made within the modified build chamber 30A, e.g., using a particle-velocimetry imaging system ("Imagery") 40 or some other flow field measurement system. As appreciated in the art, particle image velocimetry (PIV) is used to measure an instantaneous velocity field within a planar cross-section of an observed flow field, typically by measuring, e.g., via laser sensors or other specialized instruments, the displacement of tiny tracer particles over a calibrated time interval. The particle-velocimetry imaging system 40 in such an embodiment provides a digital file containing flow field data to the next logical blocks of the method 55.

An improvement metric block 103 also provides data as part of the input data set 100. The improvement metric block 103 as contemplated herein provides at least one process and/or criteria for identifying objectively better or worse flow field conditions relative to those of the baseline build chamber 30, i.e., the current construction immediately prior to simulating a given modification. Block 103 is configured to differentiate possible build chamber modifications that improve or degrade EGF function. Different potential improvement metrics from block 103 could be chosen for different baseline build chambers 30, e.g., as required due to differences in the build chambers 30 under evaluation.

The improvement metric 103 provides a standard against which the host computer device 50 can compare modeled flow fields of differently-configured modified build chambers 30A. By way of example and not of limitation, the improvement metric 103 may include a ratio of velocities or a statistical distribution thereof descriptive of different flow regions of the modified build chamber(s) 30A, with such a ratio being indicative of recirculation of suspended particles. Other possible improvement metrics 103 falling within the scope of the present disclosure include direct measurement or prediction of a resulting variability in structural properties of the resulting builds, e.g., the 3D-printed component 12 of FIG. 1, or increases in a mean, median, or total velocity or pressure in the build chamber 30, or decreases in the total, mean, median, or maximum time length duration calculated by integration along the streamlines produced at 301 as described below. Improvement metric 103 could also be restricted to a particular volume of interest, such as the volume of coverage of the laser beam (LL) of FIG. 1 that enters the build chamber 30.

Additional embodiments of the improvement metric 103 may include changes in a statistical distribution of the flow field data, such as vorticity, helicity, swirl, or another suitable quantity. Geometric changes in the streamline data such as mean, median, total, or maximum angular deviation from an expected direction of flow within the modified build chamber 30A or a particular volume thereof may also be used. Combinations such as linear weighted combinations of some are all of the above implementations also fall within the intended scope of the present disclosure.

Still referring to FIG. 2, execution of the instructions also causes the processor (P) to generate a 3D flow field data set 202*d* in response to the input data set 100. The geometry parameters 101 described above are provided to a geometry generation block 201, which in turn is configured to update any baseline geometry information with the changes or additions. That is, when starting with a baseline build chamber 30 having a defined geometry, any changes to be evaluated in accordance with the method 55 are incorporated in block 201. The method 55 could be used in a mode where a full set of flow field data is available through alternate measures, for example using the particle image velocimetry measurements from the particle-velocimetry imaging system 40 to measure a steady-state flow field moving through the baseline build chamber 30. In such a case, it would be unnecessary to use block 201.

The updated geometry is passed to a flow field generation block 202, which also receives the build chamber operating conditions 102 described above with reference to the input data set 100. Block 102 could involve performing a physical simulation and/or deriving a model via the host computer device 50 of FIG. 1 to generate a solution set containing a full flow field set of data, or block 102 could read in an experimental data set such as one generated from the optional particle-velocimetry imaging measurement system 40. Other exemplary approaches include use of a reduced-order model ("ROM"), or a supervised or unsupervised trained machine-learned model. The result of block 202 is the defined 3D flow field data set 202*d* describing the flow, including pressure and one or more input and output velocities, throughout the modified build chamber 30A.

The 3D flow field data set 202*d* is then communicated to a streamline analysis block 203, which in turn extracts streamline data 203*d* from the 3D flow field data set 202*d* and outputs the same as a vector set. Thus, execution of instructions embodying block 203 causes the processor (P) to extract a set of evacuation streamline data 203*d* from the 3D flow field data set 202*d* corresponding to the EGF performance of the modified build chamber 30A. In other words, block 203 is used to determine the effectiveness of one or more given modifications to the baseline build chamber 30, in terms of the effect of such changes on evacuation gas flow over the build plate 17B, i.e., in the scanning path of the laser beam (LL).

The streamline data 203*d* describes expected flow paths of the inert gas through the modified build chamber 30A, and is communicated to an improvement estimation block 204 for processing thereby. The extraction of the streamline data 203*d* thus vastly reduces the information set by focusing on areas of interest, excluding other areas that, were recirculation to be present in such areas, would have only a marginal effect on laser quality.

Referring briefly to FIG. 4, the modified build chamber 30A is shown schematically in an embodiment in which the laser beam (LL) is controlled by the laser device 20 and emitted thereby toward a melt pool on the build plate 17B, as appreciated in the art. As used herein and in the art, particles entrained in a gas flow when transiting a volume of the modified build chamber 30A will tend to take a circuitous route from a start point (X1) to an eventual end point (X1a), the latter ideally being an exhaust port of the modified build chamber 30. Particles suspended in a fluid, such as the argon or another suitable inert gas 22 (see FIG. 1) circulating through the modified build chamber 30A, will tend to undergo random motion, i.e., Brownian motion, in addition to motion imparted by the gas flow. Thus, smaller/more diffuse particles follow a more tortuous streamline 51 through the modified build chamber 30A relative to a streamline S2 of larger particles, or those entrained in stronger gas flow currents within the modified build chamber 30A.

Likewise, the patterns and distributions of the EGF within the modified build chamber 30A, collectively represented by the above-described flow field data set 202*d* of FIG. 2, could have the effect of dramatically shortening or lengthening the streamline of a given particle. This result can be visualized by comparing the representative streamline 51 to the more direct path of streamline S2, with streamline S2 extending from start point X2 to end point X2a. In comparison, other streamlines, e.g., S3 transiting from a start point X3 to point X3a, may indicate eddy currents or recirculating flow. Recirculation occurring primarily outside of proximity of the build plate 17B may be of little consequence to the integrity of given component being printed on the build plate 17B, being outside of the path of laser beam (LL). However, recirculation or entrainment above the build plate 17B, i.e., between the build plate 17B and the laser device 20, will tend to impede the laser beam (LL) as a debris cloud 23 (see FIG. 1) is formed, as explained above. The present teachings are therefore directed to identifying possible physical changes to the construction of the baseline build chamber 30 of FIG. 1, specifically in terms of size/dimensions, geometrical shape, addition, changes to, or removal of internal flow-directing equipment such as exhaust ports, baffles, nozzles, etc.

Referring again to FIG. 2, using the improvement metric 103 defined at block 103 of the input data set 100, the host computer device 50 receives the set of evacuation streamline data 203*d* from block 203, e.g., via an improvement estimation block 204 as shown. As the streamline data 203*d* describes the flow paths inside of the build chamber 30 for any entrained particulate matter, the criteria established at block 103 is simply applied to the streamline data 203*d* to determine, objectively using statistical analysis, e.g., a Monte Carlo analysis, integration, etc., whether the modeled structural changes to the build chamber 30 have improved or degraded evacuation gas flow performance. Block 204 may output an estimated performance as a digital file 204*d* indicative of the modeled improvement results, for instance as a set of dwell times for a collective set of entrained particles within the sweep path of the laser (LL). That is, a strong improvement metric of interest is that of debris residence time. A recirculation metric may be used in some implementations to quantity purely vortical flow behavior within the build chamber 30.

Execution of the instructions by the processor (P) shown in FIG. 1 ultimately causes the processor (P) to generate an output data set 300, which occurs in response to or using the streamline data 203*d* from block 203 and the file 204*d*. The output data set 300 collectively describes flow improvements in the EGF performance of the modified build chamber 30A (e.g., see FIGS. 4 and 6), as characterized by the improvement metric 103 described above. As illustrated in FIG. 3, the output set 300 thus includes a set of 3D streamline data 301 representing the expected flow path(s) of the streamline, e.g., as flow vectors, along with an improvement estimate 302 indicative of how much better or worse the new geometry updates are than the baseline version of the build chamber 30.

BUILD CHAMBER OPTIMIZATION: Referring now to FIG. 3, one may optimize results of the method 55 using iterative feedback. Such an alternative implementation may be used to resolve the set of geometry parameters that will ultimately optimize improvements in the configuration of the modified build chamber 30A, once again with each modified build chamber 30A serving as a baseline build chamber 30 for a next subsequent iteration.

To that end, an input data set 400 is provided as part of a method 155, with the input data set 400 in this embodiment including, e.g., typical build chamber operating conditions 401, which are analogous to block 102 of FIG. 3. The operating conditions of block 401 recreate a physical simulation of the process, such as chamber pressure, inlet and outlet velocities and boundary/initial conditions, as noted above. Alternately, experimental measurements of the flow field could be provided as part of block 401, such as particle-velocimetry imaging flow field measurements from the particle-velocimetry imaging system 40 of FIG. 3, and/or other experimental representations of the flow field, which could be read in to block 401 from a digital file. Similar to block 103 of FIG. 3, an improvement metric 402 is also provided to the host computer device 50 to govern objective functions in the present optimization process.

A starting conditions block 501 is initialized as part of a flow improvement optimizer 500. Starting conditions block 501, used only for the first iteration, may use a parameterized geometry generation block 510, for example to help create the geometry. Block 510 could be populated with geometric descriptions of discrete hardware options, e.g., baffles, chamfers such as shown in FIG. 6, vent locations and/or sizes, etc., which could be extracted and used to update a description of a given baseline build chamber 30 as needed. Initial parameters may be initialized to a random position, an intelligent guess provided by a user, or provided to a pre-processing solver step to attempt to determine an objectively or subjectively "best" initial position. The initial starting point of block 501 is then passed into an optimization loop process block 502, which will continue to iterate until predetermined optimality and/or termination conditions are satisfied.

During each subsequent iteration of the optimization loop process block 502 of FIG. 4, the current parameterized geometry is evaluated by the host computer device 50 of FIG. 1. This occurs by running an instance of method 55, shown as block 504. Block 504 entails passing the current parameterized geometry from blocks 501 (initial iteration) and 510, the build chamber operating conditions from block 401, and the improvement metric from block 402 as analogous to respective blocks 101, 102 and 103 as shown in FIG. 2.

The improvement estimate 302 (also see FIG. 2) is passed to an objective calculation block 505. Block 505 determines and records any improvement in the best solution parameters, and determines an appropriately updated set of geometry parameters to find a better solution relative to the predefined standard. Implementation of block 505 could make use of a gradient descent calculation to update such parameters, or a stochastic or random update, a pre-computed update, or another application-suitable method.

Parameters determined at block 505 are then fed to block 506 and used to update the geometry of the build chamber 30, which occurs prior to the next iteration in the optimization loop process block 502. Defined termination criteria can be used to determine when to discontinue use of block 502, possibly including a threshold objective value, a fixed number of iterations, a predetermined run time, or some other optimality condition. Block 510 feeding into block 502 is a function that could be used by block 501 (initial iteration) or block 506. Block 506 would effectively update the parameters and then invoke block 510 to generate the geometry.

Additionally, blocks 510 and 201 (FIG. 2) are similar in function. However, subtle difference may exist. One may wish to separate the parameters being optimized from the remaining parameters, and only regenerate new geometry for optimized parameters in block 510. Geometry generated in block 201 could be cached on the first iteration to improve computational performance. In some cases, block 510 may effectively serve the same purpose as block 201, in which case block 501 could replace or override block 201 function in FIG. 2.

After termination, an output data set 600 is created that identifies, at block 601, a particular optimal solution as one or more structural changes to the build chamber 30 that maximize the particular evacuation improvements being sought, e.g., in terms of ideal slipstream results. Likewise, output data set 600 includes the corresponding optimal parameters for such results, including the type of improvement (nozzle diffuser introduction, changes to baffle number, size, shape, and/or position, inlet or outlet size, shape, and/or position, wall shape, etc.). Execution of the method 55 or 155 by the processor (P) of the host computer device 50 of FIG. 1 in some embodiments causes the processor (P) and/or host computer device 50 to transmit the output data set 600 to a 3D printer and thereby command the 3D printer to construct a physical specimen of the modified build chamber 30A.

Referring briefly to FIG. 5, a representative embodiment of the baseline build chamber 30 (FIG. 5) is depicted in which streamlines Sx of various velocities V1 and V2 are present, with a heavier line weight indicating a higher velocity, i.e., the velocity V2 exceeds the velocity V1. The generally rectangular shape, as well as the size and configuration of the baseline build chamber 30 is simplified for the purpose of illustrating highly turbulent baseline flow conditions. In FIG. 5, the streamlines Sx are highly concentrated in certain regions, e.g., in representative region CC, or more diffuse such as in region DD. The methodology employed herein thus commences with quantification of the present EGF performance of the baseline build chamber 30 and seeks to improve upon it by progressively examining, quantifying, and ultimately implementing one or more modifications to the construction of the baseline build chamber 30.

As shown in FIG. 6, the modified build chamber 30A may include one or more hardware features that differ in some way from those of the baseline build chamber 30 of FIG. 5. Solely for the purpose of illustration, an exemplary feature could be that of an elongated chamfered edge 175, with the chamfered edge 175 thus changing the corresponding edge 75 of FIG. 5. Other possible features may include, e.g., the addition of holes on top of an inlet nozzle (not shown), different placement of inlet or outlet nozzles, baffles, etc., as noted generally above. These and other possible features are representative of modifications that could be made to the baseline build chamber 30 of FIG. 5, e.g., to help re-direct EGF, reduce recirculation, and improve flow throughout a volume of the modified build chamber 30A relative to the EGF performance shown in FIG. 5. Relative to FIG. 5, therefore, the comparative EGF flow performance illustrated in simplified representative form in FIG. 6 shows possible beneficial improvements to resulting concentrations, locations, and velocities of the streamlines Sx. As appreciated by those skilled in the art, actual modifications made to a given baseline build chamber 30 may be expected to vary with the intended application. Therefore, the chamfered edge 75 and other hardware variations noted above are just one possible non-limiting hardware variation that could be used in certain implementations to improve EGR performance within the scope of the disclosure.

Thus, the present method 55 of FIG. 2 and its variation 155 of FIG. 3 could be used to compare streamline improvements stemming from modifications to a baseline build chamber 30, e.g., as shown in FIG. 1. The teachings of the present disclosure could be applied to an existing baseline build chamber 30, for instance, to identify significant recirculation zones and eddy flow conditions detrimental to evacuation of debris. Changes could be evaluated iteratively or discretely for reduction in streamline length, for example, and/or for reduced dwell time of suspended particulate matter above the build plate. The foregoing teachings may be used to reduce variation in stress and fatigue in components or parts constructed using additive manufacturing processes of the type described herein. These and other benefits will be readily appreciated by those skilled in the art in view of the foregoing disclosure.

The following Clauses provide exemplary configurations of the method 55:

Clause 1: A computer-readable medium on which instructions are recorded for improving evacuation gas flow (EGF) performance of a baseline build chamber for use in an additive manufacturing process, wherein execution of the instructions by a processor of a host computer device causes the processor to: receive an input data set inclusive of an improvement metric operable to characterize flow improvements in the EGF performance of a modified build chamber, wherein the modified build chamber is a modified version of the baseline build chamber, and wherein the input data set comprises a defined geometry of the modified build chamber and defined operating conditions of the modified build chamber; generate an initial three-dimensional (3D) flow field data set in response to the input data set, the initial 3D flow field data set being indicative of a flow of an inert gas within the modified build chamber; extract a set of evacuation streamline data from the initial 3D flow field data set corresponding to the EGF performance of the modified build chamber, the set of evacuation streamline data describing expected flow paths of the inert gas through one or more predetermined regions of interest within the modified build chamber; and generate an output data set using the set of evacuation streamline data, wherein the output data set comprises the flow improvements as characterized by the improvement metric.

Clause 2: The computer-readable medium of any of clauses 1 or 3-9, wherein the execution of the instructions by the processor of the host computer device causes the processor to use the output data set to request construction of the modified build chamber.

Clause 3: The computer-readable medium of clauses 1-2 or 4-9, wherein the execution of the instructions by the processor causes the processor to receive, as part of the input data set, an initial 3D flow field data set from a computer system in communication with the host computer device.

Clause 4: The computer-readable medium of clause 3, wherein the execution of the instructions by the processor causes the processor to receive the initial 3D flow field data set from a particle-velocimetry imaging system, and wherein the computer system in communication with the host computer device comprises the particle-velocimetry imaging system.

Clause 5: The computer-readable medium of any of clauses 1-4 or 6-9, wherein the execution of the instructions by the processor causes the processor to receive the improvement metric from a human-machine interface in communication with the host computer device.

Clause 6: The computer-readable medium of any of clauses 1-5 or 7-9, wherein the defined operating conditions of include a pressure, at least one inlet velocity, and at least one outlet velocity of the inert gas.

Clause 7: The computer-readable medium of any of claim 1-6 or 8-9, wherein the execution of the instructions by the processor causes the processor to generate the initial 3D flow field data set using one or more of a physical simulation, a reduced order model, or a machine-learned model.

Clause 8: The computer-readable medium of any of claim 1-7 or 9, wherein the execution of the instructions by the processor causes the processor to quantity a residence time of a debris cloud present within the modified build chamber.

Clause 9: The computer-readable medium of any of claims 1-8, wherein the input data set comprises target performance criteria, the execution of the instructions by the processor causes the processor to perform one or more iterative loops on the output data set to thereby resolve an optimal geometric solution for the modified build chamber, and the optimal geometric solution is one in which no further improvement is realized on the improvement metric.

Clause 10: A method operable to improve evacuation gas flow (EGF) performance of a baseline build chamber for use during an additive manufacturing process, the method comprising: receiving, via a host computer device, an input data set inclusive of an improvement metric operable to characterize flow improvements in the EGF performance of a modified build chamber, wherein the modified build chamber is a modified version of the baseline build chamber, and wherein the input data set comprises a defined geometry of the modified build chamber and defined operating conditions of the modified build chamber; generating, via the host computer device, an initial three-dimensional (3D) flow field data set in response to the input data set, the initial 3D flow field data set being indicative of a flow of an inert gas within the modified build chamber; extracting, via the host computer device, a set of evacuation streamline data from the initial 3D flow field data set corresponding to the EGF performance, the set of evacuation streamline data describing expected flow paths of the inert gas through the modified build chamber; and generating, via the host computer device, an output data set using the set of evacuation streamline data, wherein the output data set comprises the flow improvements in the EGF performance of the modified build chamber as characterized by the improvement metric.

Clause 11: The method of any of clauses 10 or 12-20, further comprising: in response to the output data set, constructing the modified build chamber.

Clause 12: The method of either of any of clauses 10-11 or 13-20, further comprising constructing an aerospace component from titanium or aluminum powder stock using the modified build chamber.

Clause 13: The method of any of clauses 10-12 or 14-20, wherein the defined operating conditions comprise a chamber pressure, at least one inlet velocity, and at least one outlet velocity of the inert gas.

Clause 14: The method of any of clauses 10-13 or 15-20, wherein receiving the input data set comprises receiving the initial 3D flow field data set from a computer system in communication with the host computer device.

Clause 15: The method of clause 14, wherein receiving the initial 3D flow field data set from the computer system comprises receiving the initial 3D flow field data set from a particle-velocimetry imaging system.

Clause 16: The method of any of clauses 10-15 or 17-20, wherein receiving the input data set comprises receiving the improvement metric as a menu selection from a human-machine interface in communication with the host computer device.

Clause 17: The method of any of clauses 10-16 or 17-20, wherein generating the initial 3D flow field data set comprises using one or more of a physical simulation, a reduced order model, or a machine-learned model.

Clause 18: The method of any of clauses 10-17 or 19-20, wherein extracting the set of evacuation streamline data from the initial 3D flow field data set is performed using a recirculation estimate metric.

Clause 19: The method of any of clauses 10-18 or 20, wherein extracting the set of evacuation streamline data from the initial 3D flow field data set comprises quantifying a residence time of a debris cloud within the baseline build chamber.

Clause 20: The method of any of clauses 10-19, wherein the input data set comprises target performance criteria, the method further comprising: performing one or more iterative loops on the output data set via the host computer device to thereby resolve an optimal geometric solution for the modified build chamber, wherein the optimal geometric solution is one in which no further improvement is realized on the improvement metric.

Aspects of the present disclosure have been described in detail with reference to the illustrated embodiments. Those skilled in the art will recognize, however, that certain modifications may be made to the disclosed structure and/or methods without departing from the scope of the present disclosure. The disclosure is also not limited to the precise construction and compositions disclosed herein. Modifications apparent from the foregoing descriptions are within the scope of the disclosure as defined by the appended claims. Moreover, the present concepts expressly include combinations and sub-combinations of the preceding elements and features.

What is claimed is:

1. A non-transitory computer-readable medium on which instructions are recorded for improving evacuation gas flow (EGF) performance of a baseline build chamber for use in an additive manufacturing process, wherein execution of the instructions by a processor of a host computer device causes the processor to:

receive an input data set comprising:

an experimental data set associated with a modified build chamber, wherein:

the modified build chamber is a modified version of the baseline build chamber, and the experimental data set is obtained via a particle-velocimetry imaging system in communication with the host computer device;

a set of improvement metrics operable to characterize flow improvements in the EGF performance of the modified build chamber, wherein:

the set of improvement metrics is based on a volume of coverage of a laser beam that enters the modified build chamber, the set of improvement metrics comprises a debris residence time and a recirculation metric that quantifies vortical flow behavior within the modified build chamber;

an initial geometry of the modified build chamber; and defined operating conditions of the modified build chamber;

generate an initial three-dimensional (3D) flow field data set in response to the input data set, the initial 3D flow field data set being indicative of a flow of an inert gas within the modified build chamber;

perform a set of iterations of an optimization loop process, wherein, to perform each iteration of the set of iterations, execution of the instructions by a processor of the host computer device causes the processor to:

extract, from a data set, a set of evacuation streamline data corresponding to the EGF performance over a build plate of the modified build chamber, the set of evacuation streamline data describing expected flow paths of the inert gas through a scanning path of the laser beam, wherein:

for a first iteration of the set of iterations, the data set comprises the initial 3D flow field data set, and for each subsequent iteration of the set of iterations, the data set comprises an output data set of a previous iteration;

generate an output data set using the set of evacuation streamline data, wherein the output data set comprises a set of flow vectors, an improvement estimate based on the set of improvement metrics, and an updated geometry of the modified build chamber, and wherein the updated geometry is based on a gradient descent calculation to update a set of geometry parameters;

determine, based on the output data set, whether a termination condition is satisfied, wherein the termination condition comprises a threshold objective value associated with the output data set;

initiate a next iteration of the set of iterations when the termination condition is not satisfied; and terminate the optimization loop process when the termination condition is satisfied; and output, for transmission to a 3D printer:

an output data set of a last iteration of the set of iterations, and a command to construct the modified build chamber.

2. The non-transitory computer-readable medium of claim 1, wherein a computer system in communication with the host computer device comprises the particle-velocimetry imaging system.

3. The non-transitory computer-readable medium of claim 1, wherein the execution of the instructions by the processor further causes the processor to receive the set of improvement metrics from a human-machine interface in communication with the host computer device.

4. The non-transitory computer-readable medium of claim 1, wherein the defined operating conditions of the modified build chamber include a pressure, at least one inlet velocity, and at least one outlet velocity of the inert gas.

5. The non-transitory computer-readable medium of claim 1, wherein the execution of the instructions by the processor further causes the processor to generate the initial 3D flow field data set using one or more of a physical simulation, a reduced order model, or a machine-learned model.

6. The non-transitory computer-readable medium of claim 1, wherein the execution of the instructions by the processor further causes the processor to quantify the debris residence time of a debris cloud present within the modified build chamber.

7. The non-transitory computer-readable medium of claim 1, wherein the output data set comprises a change to one or more of:

a nozzle diffuser of the modified build chamber, baffles of the modified build chamber, an inlet of the modified build chamber, an outlet of the modified build chamber, or a wall shape of the modified build chamber.

8. The non-transitory computer-readable medium of claim 7, wherein the change is associated with one or more of:

a number, a size, a shape, or a position of the baffles;

a shape or a position of the inlet; or a shape or a position of the outlet.

9. A method operable to improve evacuation gas flow (EGF) performance of a baseline build chamber for use during an additive manufacturing process, the method comprising:

receiving, via a host computer device, an input data set comprising:

an experimental data set associated with a modified build chamber, wherein:

the modified build chamber is a modified version of the baseline build chamber, and the experimental data set is obtained via a particle-velocimetry imaging system in communication with the host computer device;

a set of improvement metrics operable to characterize flow improvements in the EGF performance of the modified build chamber, wherein:

the set of improvement metrics are based on a volume of coverage of a laser beam that enters the modified build chamber, the set of improvement metrics comprises a debris residence time and a recirculation metric that quantifies vortical flow behavior within the modified build chamber;

an initial geometry of the modified build chamber; and defined operating conditions of the modified build chamber;

generating, via the host computer device, an initial three-dimensional (3D) flow field data set in response to the input data set, the initial 3D flow field data set being indicative of a flow of an inert gas within the modified build chamber;

performing, via the host computer device, a set of iterations of an optimization loop process, wherein, performing each iteration of the set of iterations comprises:

extracting, from a data set via the host computer device, a set of evacuation streamline data corresponding to the EGF performance over a build plate of the modified build chamber, the set of evacuation streamline data describing expected flow paths of the inert gas through a scanning path of the laser beam, wherein:

for a first iteration of the set of iterations, the data set comprises the initial 3D flow field data set, and for each subsequent iteration of the set of iterations, the data set comprises an output data set of a previous iteration;

generating, via the host computer device, an output data set using the set of evacuation streamline data, wherein the output data set comprises a set of flow vectors, an improvement estimate based on the set of improvement metrics, and an updated geometry of the modified build chamber, and wherein the updated geometry is based on a gradient descent calculation to update a set of geometry parameters;

determining, via the host computer device and based on the output data set, whether a termination condition is satisfied, wherein the termination condition comprises a threshold objective value associated with the output data set;

initiating, via the host computer device, a next iteration of the set of iterations when the termination condition is not satisfied; and terminating, via the host computer device, the optimization loop process when the termination condition is satisfied; and outputting, via the host computer device for transmission to a 3D printer:

an output data set of a last iteration of the set of iterations, and a command to construct the modified build chamber.

10. The method of claim 9, further comprising:

in response to the command, constructing the modified build chamber.

11. The method of claim 9, further comprising:

constructing an aerospace component from titanium or aluminum powder stock using the modified build chamber.

12. The method of claim 9, wherein the defined operating conditions comprise a chamber pressure, at least one inlet velocity, and at least one outlet velocity of the inert gas.

13. The method of claim 9, wherein receiving the input data set further comprises receiving the set of improvement metrics as a menu selection from a human-machine interface in communication with the host computer device.

14. The method of claim 9, wherein generating the initial 3D flow field data set further comprises using one or more of a physical simulation, a reduced order model, or a machine-learned model.

15. The method of claim 9, wherein extracting the set of evacuation streamline data from the initial 3D flow field data set further comprises extracting the set of evacuation streamline data using the recirculation metric.

16. The method of claim 9, wherein extracting the set of evacuation streamline data from the initial 3D flow field data set further comprises quantifying the debris residence time of a debris cloud within the baseline build chamber.

17. The method of claim 9, wherein the output data set comprises a change to one or more of:

a nozzle diffuser of the modified build chamber, baffles of the modified build chamber, an inlet of the modified build chamber, an outlet of the modified build chamber, or a wall shape of the modified build chamber.

18. A host computer device for improving evacuation gas flow (EGF) performance of a baseline build chamber for use in an additive manufacturing process, the host computer device comprising:

memory comprising instructions; and one or more processors configured to execute the instructions and cause the one or more processors to:

receive an input data set comprising:

an experimental data set associated with a modified build chamber, wherein:

the modified build chamber is a modified version of the baseline build chamber, and the experimental data set is obtained via a particle-velocimetry imaging system in communication with the host computer device;

a set of improvement metrics operable to characterize flow improvements in the EGF performance of the modified build chamber, wherein:

the set of improvement metrics is based on a volume of coverage of a laser beam that enters the modified build chamber, the set of improvement metrics comprises a debris residence time and a recirculation metric that quantifies vortical flow behavior within the modified build chamber;

an initial geometry of the modified build chamber; and defined operating conditions of the modified build chamber;

generate an initial three-dimensional (3D) flow field data set in response to the input data set, the initial 3D flow field data set being indicative of a flow of an inert gas within the modified build chamber;

perform a set of iterations of an optimization loop process, wherein, to perform each iteration of the set of iterations, the one or more processors are configured to execute the instructions and cause the one or more processors to:

extract, from a data set, a set of evacuation streamline data corresponding to the EGF performance over a build plate of the modified build chamber, the set of evacuation streamline data describing expected flow paths of the inert gas through a scanning path of the laser beam, wherein:

for a first iteration of the set of iterations, the data set comprises the initial 3D flow field data set, and for each subsequent iteration of the set of iterations, the data set comprises an output data set of a previous iteration;

generate an output data set using the set of evacuation streamline data, wherein the output data set comprises a set of flow vectors, an improvement estimate based on the set of improvement metrics, and an updated geometry of the modified build chamber, and wherein the updated geometry is based on a gradient descent calculation to update a set of geometry parameters;

determine, based on the output data set, whether a termination condition is satisfied, wherein the termination condition comprises a threshold objective value associated with the output data set;

initiate a next iteration of the set of iterations when the termination condition is not satisfied; and terminate the optimization loop process when the termination condition is satisfied; and output, for transmission to a 3D printer:

an output data set of a last iteration of the set of iterations, and a command to construct the modified build chamber.

19. The host computer device of claim 18, wherein the one or more processors are further configured to execute the instructions and cause the one or more processors to quantify the debris residence time of a debris cloud present within the modified build chamber.

20. The host computer device of claim 18, wherein the output data set comprises a change to one or more of:

a nozzle diffuser of the modified build chamber, baffles of the modified build chamber, an inlet of the modified build chamber, an outlet of the modified build chamber, or a wall shape of the modified build chamber.

* * * * *